(12) United States Patent
Wang et al.

(10) Patent No.: US 11,127,207 B2
(45) Date of Patent: Sep. 21, 2021

(54) CRACK INSERTION IN IMPLICIT NON-LINEAR FINITE DEFORMATION ANALYSIS

(71) Applicant: ANSYS, INC., Canonsburg, PA (US)

(72) Inventors: Jin Wang, Venetia, PA (US); Deepak Hasani, Pune (IN); Siddhartha Mukherjee, Pittsburgh, PA (US); Grama Bhashyam, Bethel Park, PA (US)

(73) Assignee: Anys, Inc., Canonsburg, PA (US)

( * ) Notice: Subject to any disclaimer, the term of this patent is extended or adjusted under 35 U.S.C. 154(b) by 0 days.

(21) Appl. No.: 16/533,660

(22) Filed: Aug. 6, 2019

(65) Prior Publication Data
US 2021/0043001 A1    Feb. 11, 2021

(51) Int. Cl.
*G06T 17/20*    (2006.01)
*G06F 30/23*    (2020.01)

(52) U.S. Cl.
CPC ............ *G06T 17/205* (2013.01); *G06F 30/23* (2020.01)

(58) Field of Classification Search
None
See application file for complete search history.

(56) References Cited

U.S. PATENT DOCUMENTS

2015/0032420 A1*  1/2015  Tristano .................. G06F 30/17
                                                           703/1

OTHER PUBLICATIONS

Bremberg et al,. "Automatic crack-insertion for arbitrary crack growth", Engineering Fracture Mechanics 75 (2008) 404-416, (Year: 2008).*
Mediavilla et al., "A robust and consistent remeshing-transfer operator for ductile fracture simulations", Computers and Structures 84 (2006) 604-623 (Year: 2006).*
Bremberg, D., et al., "Automatic crack-insertion for arbitrary crack growth," Engineering Fracture Mechanics, vol. 75, Issues 3-4, Feb.-Mar. 2008, pp. 404-416.
Nart, E., et al., "Crack insertion, meshing and fracture analysis of structures using tetrahedral finite elements," European Journal of Mechanics A/Solids, vol. 30, Issue 3, May-Jun. 2011, pp. 293-306.

* cited by examiner

*Primary Examiner* — Tapas Mazumder
(74) *Attorney, Agent, or Firm* — Womble Bond Dickinson (US) LLP

(57) ABSTRACT

A deformed mesh representing an object during a deformation process is calculated. A new mesh comprising a crack to be inserted into the deformed mesh is determined. The new mesh comprising the crack is inserted into the deformed mesh to obtain a deformed mesh having the inserted new mesh during the deformation process. This may allow for the simulation of a physical process that may not otherwise be simulated.

21 Claims, 8 Drawing Sheets

CRACK INSERTION IN IMPLICIT NON-LINEAR FINITE DEFORMATION ANALYSIS

FIELD

This disclosure is related generally to non-linear finite element fracture and fatigue analysis and more particularly to crack insertion in non-linear finite deformation analysis.

BACKGROUND

Finite element method (FEM) is a method of numerical analysis to simulate the behaviors of objects. The FEM simulates the behaviors of objects using a system of algebraic equations that model finite elements into a larger system of equations that are used to perform analysis to simulate the behaviors of the object.

BRIEF DESCRIPTION OF THE DRAWINGS

Embodiments and implementations of the present disclosure will be understood more fully from the detailed description given below and from the accompanying drawings of various aspects and implementations of the disclosure, which, however, should not be taken to limit the disclosure to the specific embodiments or implementations, but are for explanation and understanding only.

DETAILED DESCRIPTION

Figure 1:
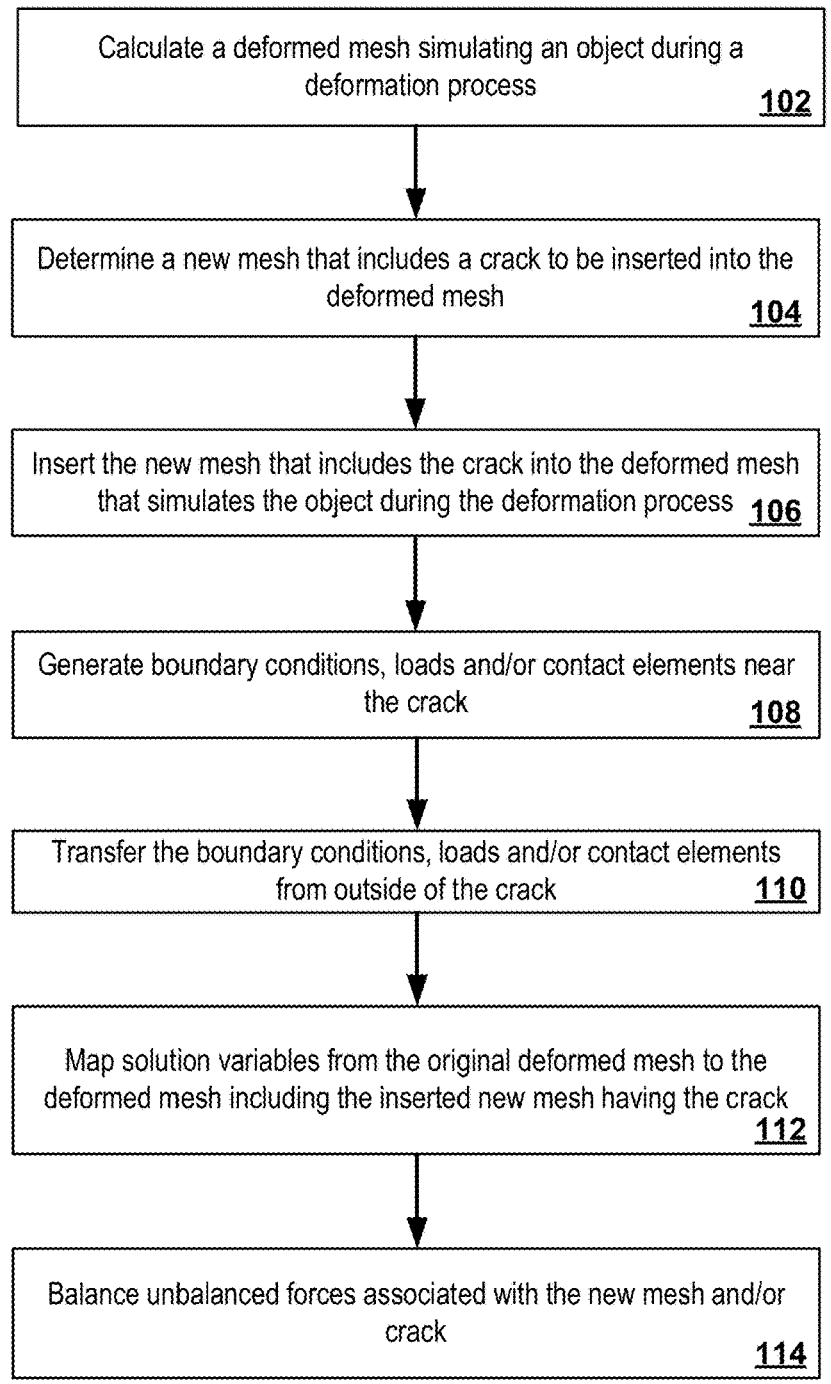
FIG. 1 is a flow diagram of a method of inserting a crack into a deformed mesh simulating an object during a deformation process, in accordance with some embodiments of the disclosure.

Systems and method as described herein provide crack insertion in non-linear finite deformation analysis. Processing logic of a computer system runs a simulation of an object during a deformation process. For example, processing logic may run a simulation of a tire that is being deformed due to various forces. The processing logic may generate a mesh corresponding to the object. The mesh may be a subdivision of geometric space into discrete geometric and topological cells. The processing logic can generate a crack in a new mesh that can be inserted into a determined location of the mesh of object during the deformation process to determine the behavior of the object with the inserted crack.

Manufactured products may include multiple micro cracks that may combine to form macro cracking during service/upon loading (e.g., during a deformation process). The formation of these macro cracks during deformation adversely affects the durability of the manufactured products. Typically, the formation of the macro cracks occurs during the deformation process and not during the initial unloaded state of the manufactured product.

Conventional simulations of an object may utilize an initial mesh of the object in an unloaded state. A simulation of a crack may then be introduced by inserting the crack into the initial mesh of the object in the unloaded state. The orientation and size of the crack inserted into the initial mesh may be decided based on the results of a previous analysis without a crack. However, for finite deformation, the deformed and initial configurations of the object may be very different. The solutions of a simulation having cracks inserted into the initial mesh may differ greatly from the previous analysis. This may result in the orientation and size of the crack (determined based on the previous analysis) being inaccurate. The orientation and size of the crack can also come from experiments or sensor detection for the parts in service, like in IoT (Internet of Things). For both of the cases, the orientation and size of the cracks can only be determined on a deformed mesh or a deformed domain of the object, and cracks can not be inserted into the initial mesh of the object.

Aspects of the present disclosure address the above and other deficiencies by inserting a crack into a deformed mesh simulating or representing the object during a deformation process. A deformed mesh may include geometric and topological cells simulating or representing the object during the deformation process and solutions thereof. For example, the deformed mesh may include or indicate loads, boundary conditions, solution variables, etc., associated with the representation of the object during the deformation process. A new mesh is determined that includes a crack. The new mesh that includes the crack is then inserted into the deformed mesh simulating the object during the deformation process. Boundary conditions, loads and/or contact elements are transferred to the new mesh including the crack from the underlying portion of the deformed mesh that does not include the crack. Optionally, new contact elements may be generated on the crack surfaces of the new mesh.

Solution variables of the deformed mesh (e.g., stress, strain, etc.) at which a crack is inserted are mapped consistently to the cracked region of the new mesh to satisfy constitutive and kinematic equations with minimum change to the solution variables' distribution in space. Unbalanced forces that are generated by the mapped solution variables resulting from the inserted new mesh including the crack are equilibrated to produce a balanced, deformed configuration including the inserted crack. The inserted cracks are stabilized during unbalanced force equilibration without the use of artificial damping or cohesive zone elements that may cause solution inaccuracy.

In some embodiments, upon running the deformation analysis of the object including the inserted crack, the processing logic may determine whether the results of the analysis satisfy a threshold to determine whether the object may fail during service. The threshold may be a minimum/maximum value of one or more of the solution variables (e.g., stress, strain, etc.) of the deformed mesh (domain) including the inserted crack. For example, the threshold may correspond to a maximum stress at a determined point in the deformed mesh.

If the results satisfy the threshold, indicating that the object may fail during service, the processing logic may adjust one or more parameters of the object. The parameters of the object may correspond to dimensions and/or material composition of the object. For example, the processing logic may adjust the fillet/blend radius of a weld joint of an object and/or material composition of the object. Upon adjusting the one or more parameters of the object, the processing logic may perform a subsequent deformation analysis on the object that includes the one or more adjusted parameters. The processing logic may then determine whether the results of the subsequent analysis of the object with adjusted parameters satisfy the threshold. If the results of the subsequent analysis also satisfy the threshold, indicating the object may fail, then the processing logic may make other adjustments to the parameters of the object. This process may be repeated until the results of the simulation of the object do not satisfy the threshold, indicating that the object is not likely to fail during service.

By inserting cracks into a deformed mesh simulating an object during a deformation process, the accuracy of the results of crack simulation are increased over conventional simulations that insert the crack into an initial mesh representing an object in an unloaded state. Furthermore, by adjusting design parameters of the object and analyzing the simulation results, resilient designs of the manufactured object that are less likely to fail due to micro/macro cracks or other forms of wear may be generated.

FIG. 1 is a flow diagram of a method 100 of inserting a crack into a deformed mesh simulating an object during a deformation process, in accordance with some embodiments of the disclosure. The method 100 may be performed by processing logic that comprises hardware (e.g., circuitry, dedicated logic, programmable logic, microcode, etc.), software (e.g., instructions run on a processing device to perform hardware simulation), or a combination thereof.

With reference to FIG. 1, method 100 illustrates example functions used by various embodiments. Although specific function blocks ("blocks") are disclosed in method 100, such blocks are examples. That is, embodiments are well suited to performing various other blocks or variations of the blocks recited in method 100. It is appreciated that the blocks in method 100 may be performed in an order different than presented, and that not all of the blocks in method 100 may be performed.

Method 100 may begin at block 102 with the processing logic calculating a deformed mesh simulating (or representing, modeling) an object during a deformation process. The deformed mesh may correspond to a simulation of an object that is exposed to one or more forces being exerted on the object to simulate service/use of the object. For example, the deformed mesh may correspond to a simulation of a tire, automobile engine, automobile body/parts, aircraft engine, fuselage, rubber sealing, riser and drilling simulations in the oil and gas industry, etc. during service/use. In some embodiments, the processing logic may calculate the deformed mesh based on received inputs associated with the object. For example, a user/designer may provide inputs, such as dimensions, materials, etc. of the object to the processing logic and the processing logic may generate the deformed mesh. In embodiments, the processing logic may receive the deformed mesh from a previously run deformation analysis of the object.

At block 104, the processing logic determines a new mesh that includes a crack to be inserted into the deformed mesh. In embodiments, the processing logic may determine the new mesh including the crack based on received inputs associated with the new mesh and/or the crack. For example, a user/designer may provide inputs, based on experimental data, such as dimensions, orientation, etc. of the crack to the processing logic and the processing logic may determine the new mesh including the crack based on the received inputs. In embodiments, the processing logic may receive the new mesh including the crack from a previously run simulation. In an embodiment, the processing logic may determine multiple new meshes including cracks to be inserted at various locations and orientations on the deformed mesh.

At block 106, the processing logic inserts the new mesh that includes the crack into the deformed mesh that simulates the object during the deformation process. The processing logic may insert the new mesh that includes the crack at a determined location and orientation on the deformed mesh. In some embodiments, the location may be determined based on received inputs specifying the location and orientation for the insertion of the new mesh. For example, a user/designer may provide inputs to the processing logic that specify the location and orientation for the insertion of the new mesh. In embodiments, the processing logic may automatically determine the location for the insertion of the new mesh. For example, the processing logic may determine a location and orientation of the object that a crack is likely to form during use and insert the crack at the determined location and orientation. In some embodiments, a portion of the initial deformed mesh that corresponds to the location and orientation of the new mesh may be deleted to allow the new mesh to be inserted. For example, the processing logic may delete the underlying deformed mesh that does not include a crack from the initial deformed mesh to allow for the insertion of the new mesh that does include the crack.

At block 108, the processing logic generates boundary conditions, loads and/or elements near the crack. The processing logic may automatically identify facets of the crack in the new mesh and generate boundary conditions, loads and/or elements near the crack. The boundary conditions may correspond to constraints for the solution/results of the deformation analysis of the object. The boundary conditions may be scalar or degree of freedom (DOF) based. The loads may correspond to surface loads, nodal displacements, concentrated forces, etc., located near the inserted crack.

The elements may correspond to contact elements and/or target elements located near the crack. The contact elements and/or target elements may be automatically generated for new facets (e.g., the crack) of the mesh when requested by user. The contact elements may correspond to contact points located on a contact surface of the deformed mesh, while the target elements may correspond to points located on a target surface. A contact element may have a corresponding target element to form a contact pair. For example, a contact pair may include a contact element corresponding to a contact point on a deformed mesh simulating a tire and a target element corresponding to a point located on a target surface (e.g., a simulation or a representation of a solid surface like a road). In embodiments, a user/designer may add new contact/target elements as needed by providing inputs to the processing logic.

At block 110, the processing logic transfers the boundary conditions, loads and/or contact elements from outside the crack. The boundary conditions, loads and/or contact elements from the underlying deformed mesh that does not include the inserted crack may be transferred to the new, inserted mesh.

At block 112, the processing logic maps solution variables from the original deformed mesh to a deformed mesh that includes the inserted new mesh having the crack. The processing logic may map the solution variables by transferring the solution variables from the original deformed mesh to the deformed mesh that includes the inserted new mesh having the crack. While mapping the solution variables, the processing logic may not consider the discontinuity introduced by the crack in the new mesh. Nodal solutions, such as displacements and temperatures, may be mapped with shape functions. Strains and deformation gradient tensors are recalculated based on mapped displacements so that kinematic relations are maintained. For material solution variables, the processing logic may determine to only map the primary solutions, such as equivalent plastic strain. The processing logic may recalculate dependent variables, such as yield stress.

In embodiments having a crack inserted into a plastic zone of an object, the processing logic may determine that the mapped material point is on the yield surface. Using an example of isotropic hardening, the processing logic may perform the following:

Calculate the trial elastic strain: $\varepsilon_{ij}^{e*}=\varepsilon_{ij}-\varepsilon_{ij}^{p}-\varepsilon_{ij}^{th}$, where $\varepsilon_{ij}$, $\varepsilon_{ij}^{p}$, and $\varepsilon_{ij}^{th}$ are total strain components, plastic strain components and thermal strain components individually, mapped to the cracked mesh Calculate the trial stress: $\sigma_{ij}^{*}=D_{ijkl}\varepsilon_{kl}^{e*}$, where $D_{ijkl}$ is material constitutive tensor Calculate the Von-Mises equivalent stress:

$$\sigma_{eq}^{*} = \sqrt{\frac{3}{2}\sigma_{ij}^{*\prime}\sigma_{ij}^{*\prime}}$$

where $\sigma_{ij}^{*\prime}$ corresponds to deviatoric trial stress

If $\sigma_{eq}^{*} \leq \sigma_s$, elastic strain: $\varepsilon_{ij}^{e}=\varepsilon_{ij}^{e*}$; and stress $\sigma_{ij}=\sigma_{ij}^{*}$), where $\sigma_s$ is the yield stress calculated based on state variables mapped from the uncracked mesh; $\varepsilon_{ij}^{e}$ and $\nu_{ij}$ are taken as results of the new mesh Else, push back to the yield surface:
By:

$$\varepsilon_{ij}^{e} = \frac{\sigma_s}{\sigma_{eq}^{*}}\varepsilon_{ij}^{e*}$$

and $\sigma_{ij}=D_{ijkl}\sigma_{kl}^{e*}$, $\varepsilon_{ij}^{e}$ and $\sigma_{ij}$ are taken as results of the new mesh Update strain by: $\varepsilon_{ij}=\varepsilon_{ij}^{e}+\varepsilon_{ij}^{p}+\varepsilon_{ij}^{th}$, taken as the total strain of the new mesh.

At block 114, the processing logic balances unbalanced forces associated with the new mesh and/or the crack. Additional details regarding the balancing of unbalanced forces will be discussed at FIGS. 6A and 6B below.

Figure 2:
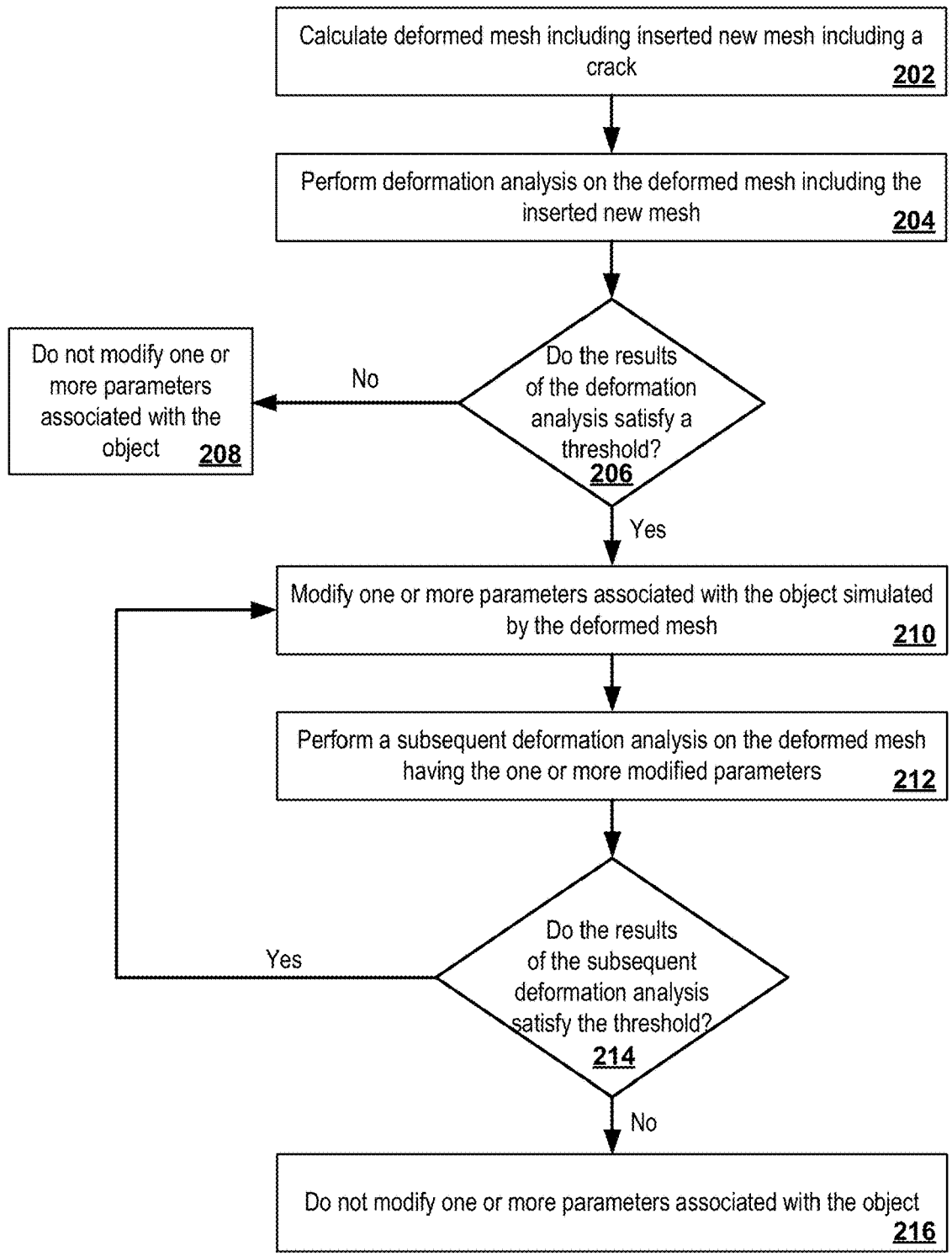
FIG. 2 is a flow diagram of a method of modifying one or more parameters of an object based on the results of a simulation, in accordance with some embodiments of the disclosure.

FIG. 2 is a flow diagram of a method 200 of modifying one or more parameters of an object based on the results of a simulation, in accordance with some embodiments of the disclosure. The method 200 may be performed by processing logic that comprises hardware (e.g., circuitry, dedicated logic, programmable logic, microcode, etc.), software (e.g., instructions run on a processing device to perform hardware simulation), or a combination thereof.

With reference to FIG. 2, method 200 illustrates example functions used by various embodiments. Although specific function blocks ("blocks") are disclosed in method 200, such blocks are examples. That is, embodiments are well suited to performing various other blocks or variations of the blocks recited in method 200. It is appreciated that the blocks in method 200 may be performed in an order different than presented, and that not all of the blocks in method 200 may be performed.

Method 200 may begin at block 202 with the processing logic calculates a deformed mesh that includes an inserted new mesh having a crack, as previously described at FIG. 1.

At block 204, the processing logic performs deformation analysis on the deformed mesh that includes the inserted new mesh. The deformation analysis may simulate conditions experienced by an object during a deformation process, such as when the object is in use.

At block 206, the processing logic determines if the results of the deformation analysis satisfy a threshold to determine whether the object may fail during use. The threshold may be a minimum/maximum value of one or more of the solution variables (e.g., stress, strain, etc.) of the deformed mesh including the inserted crack. For example, the threshold may correspond to a maximum stress at a determined point in the deformed mesh. In some embodiments, the results may satisfy the threshold if the results are greater than or equal to the threshold. In other embodiments, the results may satisfy the threshold if the results are less than or equal to the threshold.

If the results of the deformation analysis do not satisfy the threshold, indicating the object is not likely to fail during use, at block 208 the processing logic determines to not modify any of the parameters associated with the object.

If the results of the deformation analysis satisfy the threshold, indicating the object may fail during use, at block 210 the processing logic modifies one or more parameters associated with the object simulated (or modeled) by the deformed mesh. The parameters of the object may correspond to dimensions and/or material composition of the object. For example, the processing logic may adjust the fillet/blend radius of a weld joint of an object and/or material composition of the object.

Upon adjusting the one or more parameters, at block 212 the processing logic performs a subsequent deformation analysis on the deformed mesh having the one or more modified parameters.

At block 214, the processing logic determines if the results of the subsequent deformation analysis satisfy the threshold to determine whether the object having the modified parameters may fail during use.

If the results satisfy the threshold, method 200 returns to block 210 where one or more parameters are modified. If the results do not satisfy the threshold, then at block 216 the processing logic determines to not modify one or more parameters of the object.

Figure 3:
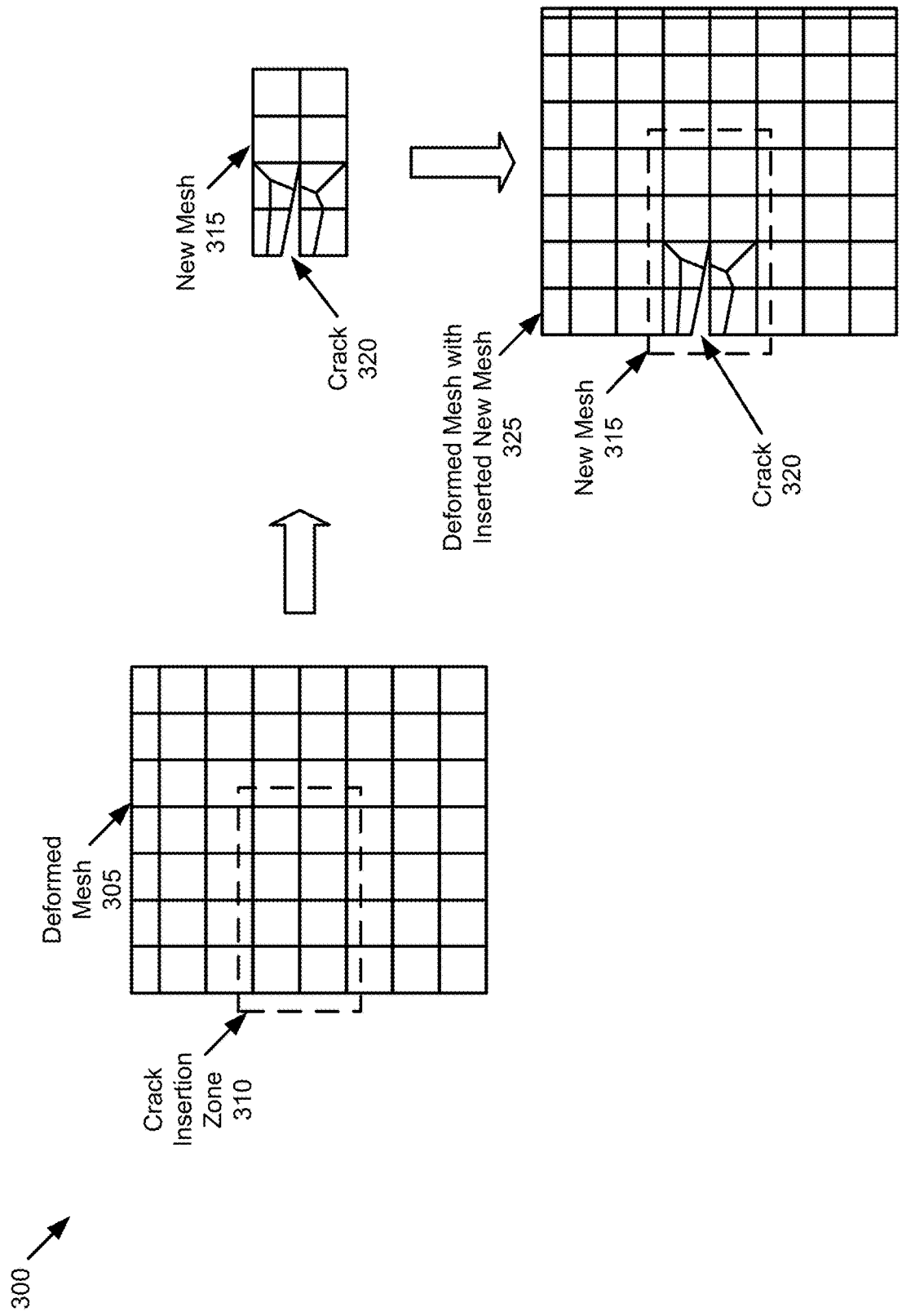
FIG. 3 is an illustration of an example of inserting a new mesh having a crack into a deformed mesh in accordance with embodiments of the disclosure.

FIG. 3 is an illustration 300 of an example of inserting a new mesh having a crack into a deformed mesh in accordance with embodiments of the disclosure. Illustration 300 includes a deformed mesh 305 that simulates or represents an object during a deformation process. The mesh may be a subdivision of geometric space into discrete geometric and topological cells. The deformed mesh 305 includes a crack insertion zone 310 that corresponds to a portion of deformed mesh 305 where a new mesh 315 including a crack 320 is to be inserted.

The new mesh 315 includes crack 320 that is embedded in a local block of elements of the new mesh 315. The faces of crack 320 may be automatically identified and mapped to corresponding elements in the crack insertion zone 310 of the deformed mesh 305. Then, the portion of the deformed mesh 305 in the crack insertion zone 310 may be deleted to allow for the new mesh 315 including the crack 320 to be inserted into the deformed mesh 305 at the crack insertion zone 310, resulting in a deformed mesh with inserted new mesh 325.

Figure 4A:
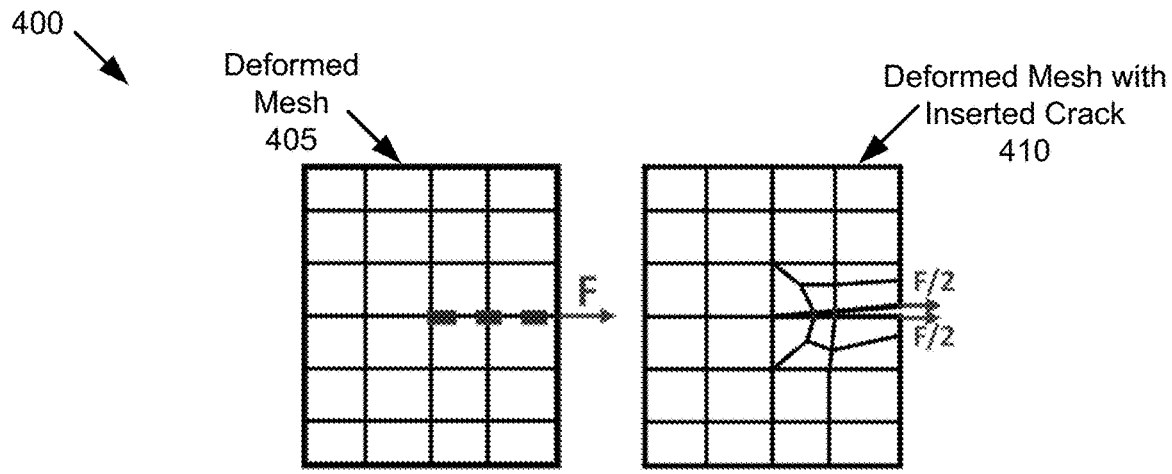
FIG. 4A is an illustration of an example of mapping concentrated forces near a crack of a deformed mesh in accordance with embodiments of the disclosure.

FIG. 4A is an illustration 400 of an example of mapping concentrated forces near a crack of a deformed mesh in accordance with embodiments of the disclosure. Illustration 400 includes deformed mesh 405 that corresponds to the initial deformed mesh prior to insertion of a crack. Illustration 400 further includes a deformed mesh with inserted crack 410. The deformed mesh 405 includes a concentrated force, F, that corresponds to a force acting along a single line in space. Inserting the crack in the deformed mesh with the inserted crack 410 results in two concentrated forces, F/2, each acting along a different line in space and having half the magnitude of concentrated force, F.

Figure 4B:
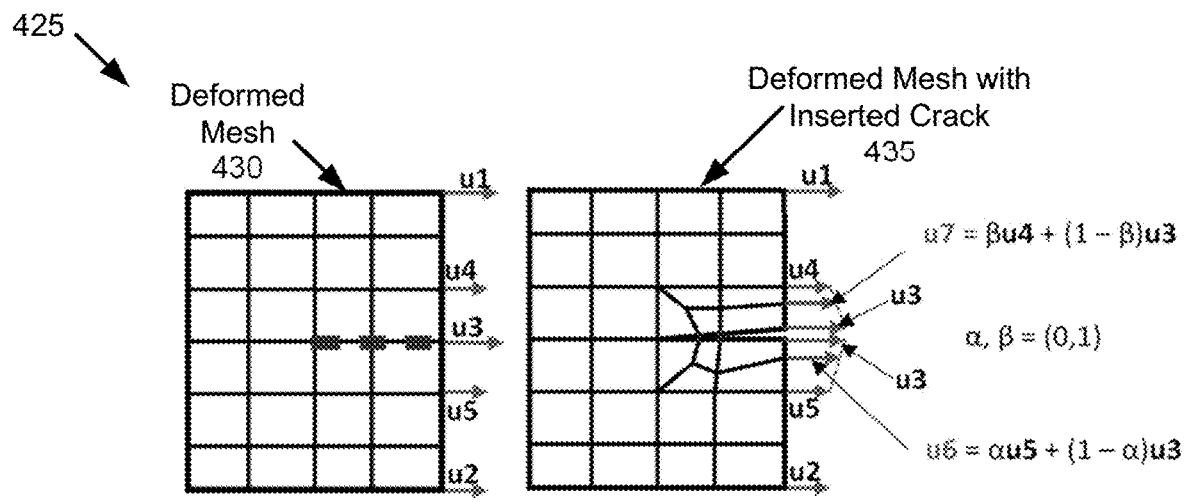
FIG. 4B is an illustration of an example of mapping nodal displacements near a crack of a deformed mesh in accordance with embodiments of the disclosure.

FIG. 4B is an illustration 425 of an example of mapping nodal displacements near a crack of a deformed mesh in accordance with embodiments of the disclosure. Illustration 425 includes deformed mesh 430 that corresponds to the initial deformed mesh prior to insertion of a crack. Illustration 425 further includes a deformed mesh with inserted crack 435. The deformed mesh 430 includes nodal displacements u1-u5 that correspond to the displacements of corresponding nodes of the deformed mesh 430. Inserting the crack in the deformed mesh with the inserted crack 435 results in two of nodal displacement u3, located on either side of the crack facet. Inserting the crack also results in two additional nodal displacements (e.g., u6 and u7) located near the crack facet. The additional nodal displacements may be determined using the following equations:

$$u6 = \alpha u5 + (1-\alpha) u3$$

$$u7 = \beta u4 + (1-\beta) u3$$

where $\alpha, \beta = (0,1)$

Figure 4C:
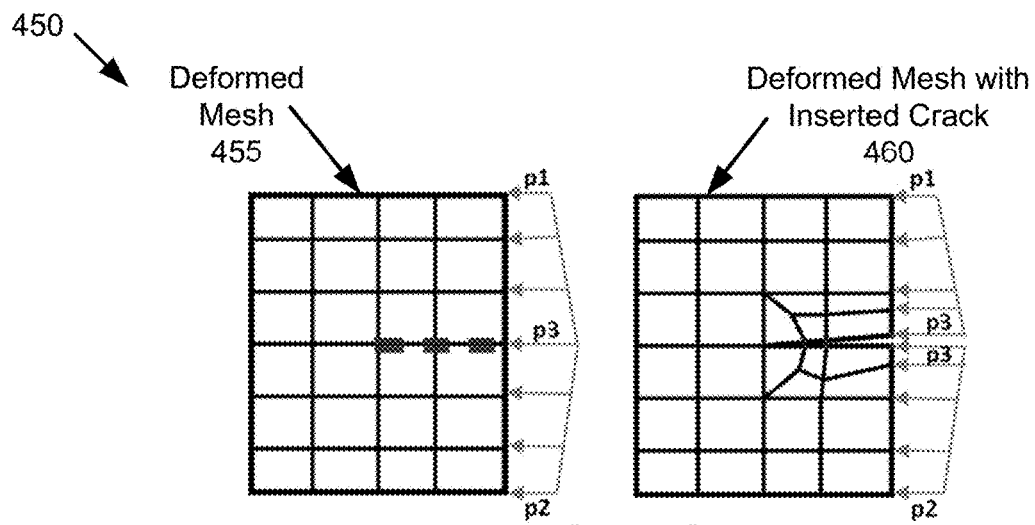
FIG. 4C is an illustration of an example of mapping surface loads near a crack of a deformed mesh in accordance with embodiments of the disclosure.

FIG. 4C is an illustration 450 of an example of mapping surface loads near a crack of a deformed mesh in accordance with embodiments of the disclosure. Illustration 450 includes deformed mesh 455 that corresponds to the initial deformed mesh prior to insertion of a crack. Illustration 450 further includes a deformed mesh with inserted crack 460. The deformed mesh 455 includes surface loads p1-p3 that correspond to weight distributed loads along the surface of deformed mesh 455. Inserting the crack in the deformed mesh with the inserted crack 460 results in two surface loads (e.g., p1 to p3 and p2 to p3), located on either side of the crack facet.

Figure 5:
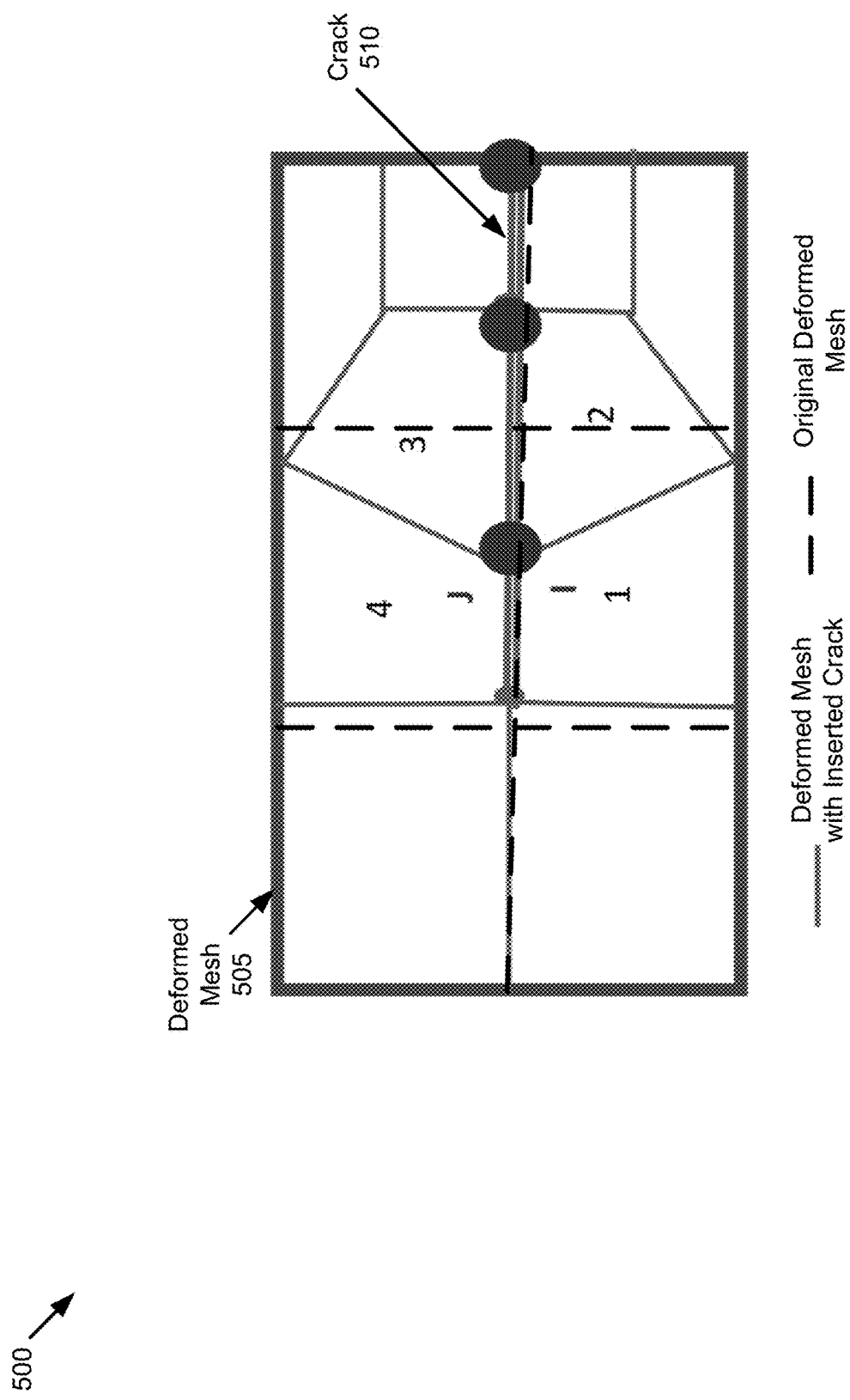
FIG. 5 is an illustration of an example of minimizing unbalanced forces near a crack, in accordance with embodiments of the disclosure.

FIG. 5 is an illustration 500 of an example of minimizing unbalanced forces near a crack, in accordance with embodiments of the disclosure. Illustration 500 includes a deformed mesh 505 (shown in dashed lines), and new mesh having an inserted crack 510 (shown in solid lines), as previously described. New Element 1 and 2 shares Node I, and new Element 3 and 4 share Node J. When I=J, all the four elements share the same node so that the crack is closed at the node. To minimize the unbalanced forces at the crack in a finite deformed configuration, the following algorithm(s) may be used:

Example 1

The unbalanced force when I=J (e.g., when the crack remains closed), caused by mapping the solution variable:
$f_I^{ext} - f_I^{int*} = f_I^{ext} - [\Pi_{n=1}^{4} \int [B_n^T][\sigma^*] dV]_{atI}$ where $f_I^{ext}$ is the applied external loads at node I;
$f_I^{int*} = [\Pi_{n=1}^{4} \int [B_n^T][\sigma^*] dV]_{atI}$ is the internal force at node I based on mapped stress $[\sigma^*]$;
$[B_n^T]$ is the transferred matrix of B at element n; V is the volume.

Example 2

The unbalanced force when I≠J (e.g., when the crack is opened), but the residual force caused by mapping is balanced:
$f_I^{ext} - f_I^{intB} = f_I^{ext} - [\Pi_{n=1}^{2} \int [B_n^T][\sigma^B] dV]_{atI}$
$f_J^{ext} - f_J^{intB} = f_J^{ext} - [\Pi_{n=3}^{4} \int [B_n^T][\sigma^B] dV]_{atJ}$ where $f_I^{intB}$ is the internal force at Node I based on balanced stress $[\sigma^B]$;
$f_J^{intB}$ is the internal force at Node J based on balanced stress $[\sigma^B]$, and $f_I^{ext}$ & $f_J^{ext}$ are the applied external loads at node I and J respectively.

Example 3

The unbalanced force when I≠J (e.g., when the crack is opened), but the residual force caused by mapping is not balanced:
$f_I^{ext} - f_I^{int} = f_I^{ext} - [\Pi_{n=1}^{2} \int [B_n^T][\sigma^*] dV]_{atI}$
$f_J^{ext} - f_J^{int} = f_J^{ext} - [\Pi_{n=3}^{4} \int [B_n^T][\sigma^*] dV]_{atJ}$, where
$f_I^{int}$ is the internal forces at node I based on mapped stress$[\sigma^*]$; $f_J^{int}$ is the internal forces at node J based on mapped stress $[\sigma^*]$, and
$f_I^{ext}$ & $f_J^{ext}$ are the applied external loads at node I and J respectively.

Figure 6A:
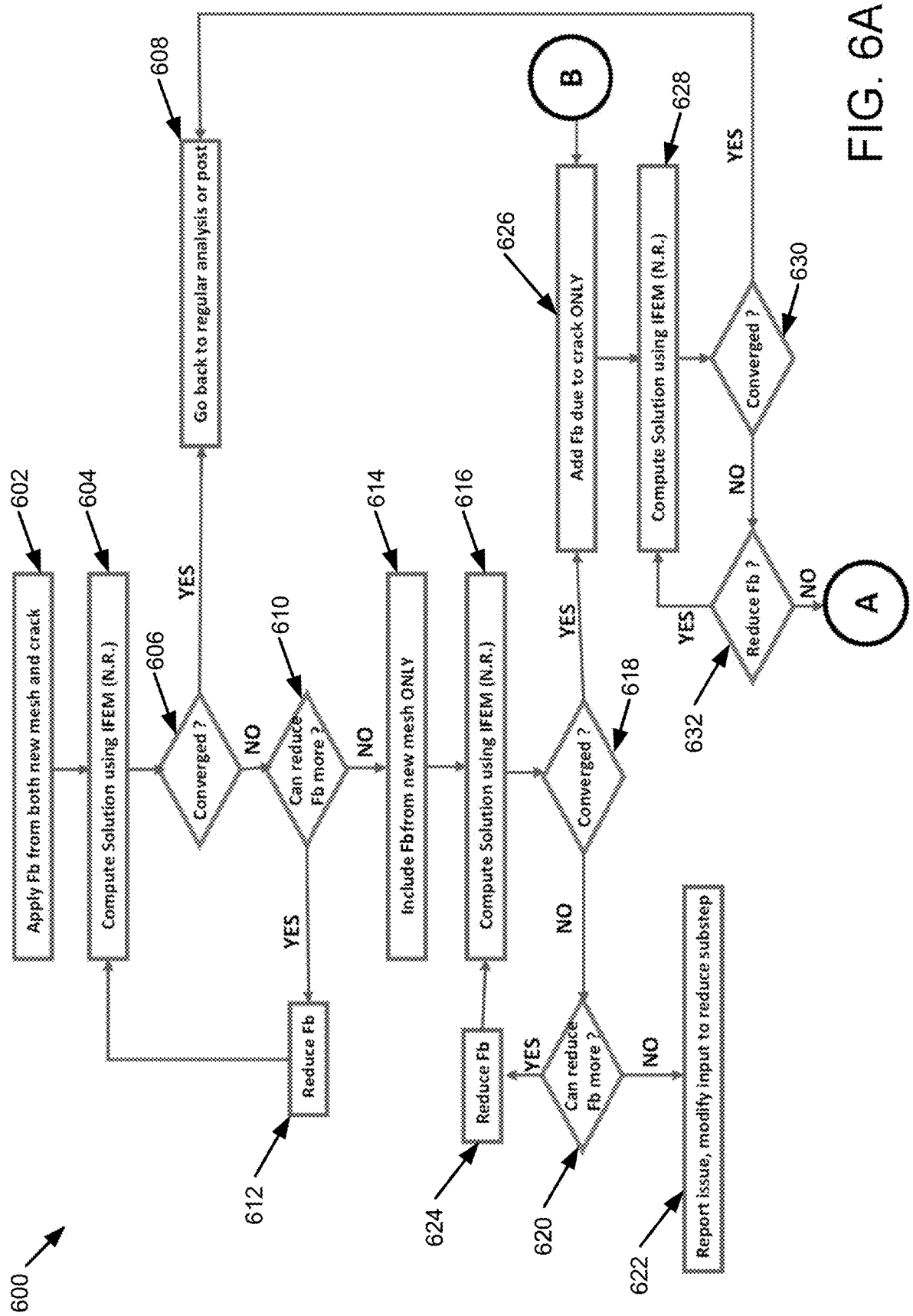
FIG. 6A is a flow diagram of a method of rebalancing forces of a deformed mesh after crack insertion, in accordance with some embodiments of the disclosure.

FIG. 6A is a flow diagram of a method 600 of rebalancing forces of a deformed mesh after crack insertion, in accordance with some embodiments of the disclosure. The method 600 may be performed by processing logic that comprises hardware (e.g., circuitry, dedicated logic, programmable logic, microcode, etc.), software (e.g., instructions run on a processing device to perform hardware simulation), or a combination thereof.

With reference to FIG. 6A, method 600 illustrates example functions used by various embodiments. Although specific function blocks ("blocks") are disclosed in method 600, such blocks are examples. That is, embodiments are well suited to performing various other blocks or variations of the blocks recited in method 600. It is appreciated that the blocks in method 600 may be performed in an order different than presented, and that not all of the blocks in method 600 may be performed.

Method 600 may begin at block 602 with the processing logic applying an unbalanced force (Fb) from both the new mesh and crack. At block 604, the processing logic computes a solution using implicit FEM (IFEM). In embodiments, the solution may be computed using the Newton-Raphson (N.R.) method.

At block 606, the processing logic determines if the solution computed at block 604 has converged. If the solution has converged, at block 608 the processing logic resumes regular deformation analysis and/or posts the solution/results.

If the solution has not converged, at block 610 the processing logic determines if the unbalanced forces can be reduced. If the processing logic determines that the unbalanced forces can be reduced, at block 612 the processing logic reduces the unbalanced forces and a new solution is computed using IFEM.

If the unbalanced forces cannot be reduced, at block 614 the processing logic includes only the residual forces ($F_b$) from the new mesh including the crack that was inserted into the deformed mesh, by keeping the crack closed. At block 616, the processing logic computers a solution using IFEM.

At block 618, the processing logic determines if the solution computed at block 616 has converged. If the solution has not converged, at block 620 the processing logic determines if the unbalanced forces can be reduced. If the unbalanced forces cannot be reduced, at block 622 the processing logic reports an issue and/or modifies inputs of the model. If the unbalanced forces can be reduced, at block 624 the processing logic reduces the unbalanced forces and computes a new solution using IFEM.

Returning to block 618, if the computed solution has converged, at block 626 the processing logic adds unbalanced forces due to the crack in the inserted new mesh, by opening the crack. After adding the unbalanced forces due to the crack, at block 628 the processing logic computes a solution using IFEM.

At block 630, the processing logic determines if the solution computed at block 628 has converged. If the solution has converged, at block 608 the processing logic resumes regular deformation analysis and/or posts the solution/results.

If the solution has not converged, at block 632 the processing logic determines if the unbalanced forces can be reduced. If the processing logic determines that the unbalanced forces can be reduced, the processing logic reduces the unbalanced forces and a new solution is computed using IFEM. If the processing logic determines that the unbalanced forces cannot be reduced, method 600 proceeds to the method described below at FIG. 6B.

Figure 6B:
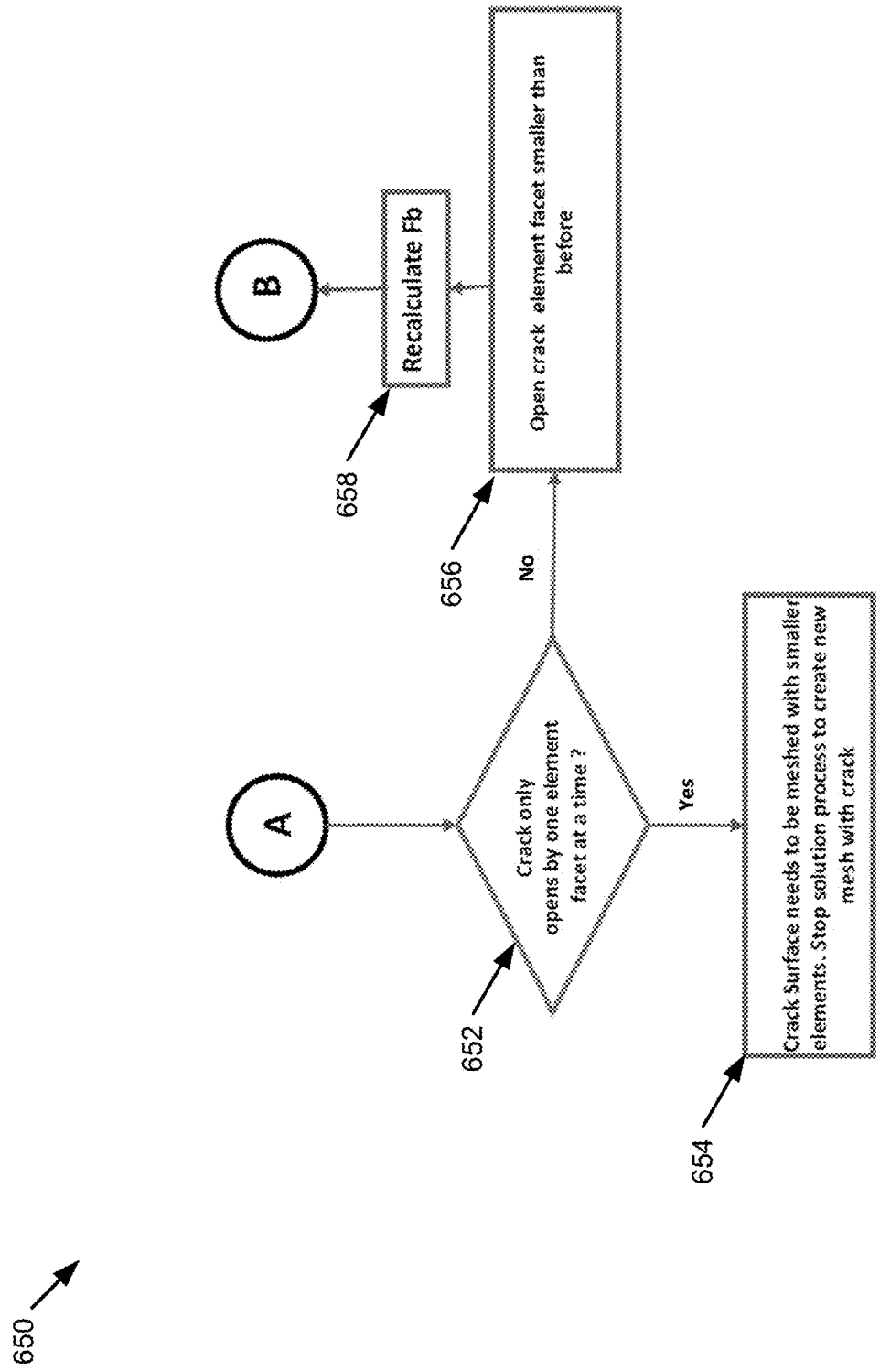
FIG. 6B is a flow diagram of a method of rebalancing forces of a deformed mesh after crack insertion, in accordance with some embodiments of the disclosure.

FIG. 6B is a flow diagram of a method 650 of rebalancing forces of a deformed mesh after crack insertion, in accordance with some embodiments of the disclosure. The method 600 may be performed by processing logic that comprises hardware (e.g., circuitry, dedicated logic, programmable logic, microcode, etc.), software (e.g., instructions run on a processing device to perform hardware simulation), or a combination thereof.

With reference to FIG. 6B, method 650 illustrates example functions used by various embodiments. Although specific function blocks ("blocks") are disclosed in method 650, such blocks are examples. That is, embodiments are well suited to performing various other blocks or variations of the blocks recited in method 650. It is appreciated that the blocks in method 650 may be performed in an order different than presented, and that not all of the blocks in method 650 may be performed.

Method 650 may begin at block 652 with the processing logic determine if the crack only opens by one element facet at a time in response to determining that the unbalanced forces cannot be reduced at block 632 of FIG. 6A. If the crack opens one element facet at a time, at block 654 the processing logic determines that the crack surface needs to be meshed with smaller elements. The processing logic may then stop the solution process to create a new mesh with the crack that has smaller elements. If the crack does not open one element facet at a time, at block 656 the processing logic opens the crack element facet smaller than previously opened until it reaches one element. At block 658, the processing logic recalculates the unbalanced forces with the smaller crack opening. Method 650 may then proceed to block 626 of FIG. 6A.

Figure 7:
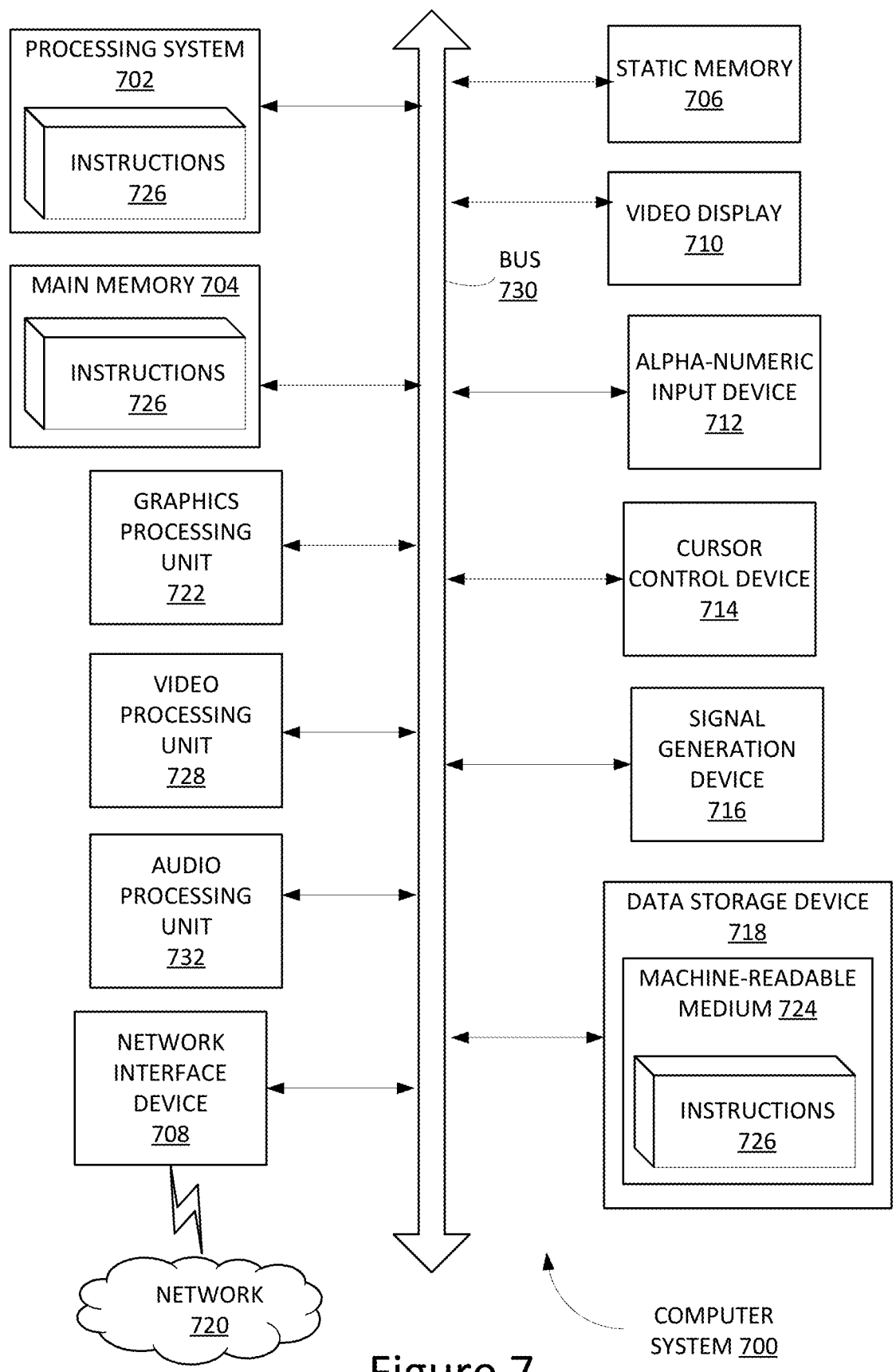
FIG. 7 illustrates an illustrative computer system operating in accordance with one or more aspects of the present disclosure.

FIG. 7 illustrates a diagrammatic representation of a machine in the exemplary form of a computer system 700 within which a set of instructions, for causing the machine to perform any one or more of the methodologies discussed herein, may be executed. In some embodiments of the present invention, the machine may be connected (e.g., networked) to other machines (e.g., other computer systems in a network) in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In some embodiments, computer system 700 may be implemented in a cloud-based platform.

The exemplary computer system 700 includes a processing system 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory (e.g., a data storage device), which communicate with each other via a bus 730.

The processing system 702 represents one or more processors such as a microprocessor, central processing unit, or the like. The term "processing system" is used herein to refer to any combination of one or more integrated circuits and/or packages that include one or more processors (e.g., one or more processor cores). Therefore, the term processing system encompasses a single core CPU (computer processing unit), a multi-core CPU and a massively multi-core system that includes many interconnected integrated circuits, each of which may include multiple processor cores. The processing system 702 may therefore include multiple processors. The processing system 702 may include a complex instruction set computing (CISC) microprocessor, reduced instruction set computing (RISC) microprocessor, very long instruction word (VLIW) microprocessor, processor implementing other instruction sets, or processors implementing a combination of instruction sets. The processing system 702 may also be one or more special-purpose processing devices such as an application specific integrated circuit (ASIC), a field programmable gate array (FPGA), a digital signal processor (DSP), network processor, system on chip (SoC), or the like. The computer system 700 may include a graphics processing unit 722, a video processing unit 728, and an audio processing unit 732.

The computer system 700 may further include a network interface device 708. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), and a signal generation device 716 (e.g., a speaker).

The data storage device 718 may include a machine-readable storage medium (or more specifically a computer-readable storage medium) 724 on which is stored one or more sets of instructions 726 embodying any one or more of the methodologies or functions described herein. The instructions 726 may also reside, completely or at least partially, within the main memory 704 and/or within the processing system 702 during execution thereof by the computer system 700, the main memory 704 and the processing system 702 also constituting machine-readable storage media. Main memory 704 or data storage device 718 may include a shared memory space for communication between various components executed by instructions as described herein.

While the computer-readable storage medium 724 is shown in an exemplary embodiment to be a single medium, the term "computer-readable storage medium" (or "computer-readable medium") should be taken to include a single medium or multiple media (e.g., a centralized or distributed database, and/or associated caches and servers) that store the one or more sets of instructions. The term "computer-readable storage medium" shall also be taken to include any medium other than a carrier wave that is capable of storing or encoding a set of instructions for execution by the machine that cause the machine to perform any one or more of the methodologies disclosed herein. The term "computer-readable storage medium" shall accordingly be taken to include, but not be limited to, non-transitory media such as solid-state memories, and optical and magnetic media.

The modules, components and other features described herein can be implemented as discrete hardware components or integrated in the functionality of hardware components such as ASICS, FPGAs, DSPs, SoCs, or similar devices. In addition, the modules can be implemented as firmware or functional circuitry within hardware devices. Further, the modules can be implemented in any combination of hardware devices and software components, or only in software.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "adding", "receiving", "determining", "routing", "performing", or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The terms "first", "second", "third", "fourth", etc. as used herein are meant as labels to distinguish among different elements and may not necessarily have an ordinal meaning according to their numerical designation.

Embodiments of the present invention also relate to an apparatus for performing the operations herein. This apparatus may be specially constructed for the required purposes, or it may comprise a computer system selectively programmed by a computer program stored in the computer system. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic disk storage media, optical storage media, flash memory devices, other type of machine-accessible storage media, or any type of media suitable for storing electronic instructions, each coupled to a computer system bus.

The algorithms and displays presented herein are not inherently related to any particular computer or other apparatus. Various computer systems may be used with programs in accordance with the teachings herein, or it may prove convenient to construct more specialized apparatus to perform the required method steps. The required structure for a variety of these systems will appear as set forth in the description above. In addition, the present invention is not described with reference to any particular programming language. It will be appreciated that a variety of programming languages may be used to implement the teachings of the invention as described herein.

It is to be understood that the above description is intended to be illustrative, and not restrictive. Many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense. The scope of the invention should, therefore, be determined with reference to the appended claims, along with the full scope of equivalents to which such claims are entitled.

The invention claimed is:

1. A method comprising:
   calculating, by a processing system, a deformed mesh representing an object during a deformation process;
   determining, by the processing system, a new mesh comprising a crack to be inserted into the deformed mesh;
   inserting, by the processing system, the new mesh comprising the crack into the deformed mesh to obtain a deformed mesh having the inserted new mesh for simulating the deformation process, wherein variables are transferred from the deformed mesh to the deformed mesh having the inserted new mesh;
   performing deformation analysis on the deformed mesh having the inserted new mesh;
   determining whether results of the performed deformation analysis satisfy a threshold;

adjusting one or more parameters of the object represented by the deformed mesh having the inserted new mesh, wherein the one or more parameters are adjusted in response to determining the results of the performed deformation analysis satisfy the threshold;

performing a further deformation analysis using the adjusted one or more parameters; and determining whether results of the further deformation analysis satisfy the threshold.

2. The method of claim 1, wherein the deformation analysis includes simulation of conditions experienced by the object during the deformation process.

3. The method of claim 1, wherein the one or more parameters comprise a dimension associated with the object or a material associated with the object.

4. The method of claim 1, wherein determining the new mesh comprising the crack to be inserted into the deformed mesh further comprises:

identifying size, orientation and location of the crack; and in response to a request, generating contact elements or target elements based on the identified size, orientation and location of the crack.

5. The method of claim 1, further comprising:

mapping boundary conditions and loads from the deformed mesh to the deformed mesh having the inserted new mesh comprising the crack to transfer the variables from the deformed mesh to the deformed mesh having the inserted new mesh comprising the crack.

6. The method of claim 1, further comprising:

mapping solution variables consistently from the deformed mesh to the inserted new mesh comprising the crack to satisfy constitutive and kinematic equations with minimum change to a distribution in space of the solution variables.

7. The method of claim 1, further comprising:

upon inserting the new mesh comprising the crack into the deformed mesh, balancing unbalanced forces associated with the crack in the new mesh.

8. A data processing system comprising:

a memory; and a processing system, operatively coupled to the memory, to:

calculate a deformed mesh representing an object during a deformation process;

determine a new mesh comprising a crack to be inserted into the deformed mesh;

insert the new mesh comprising the crack into the deformed mesh to obtain a deformed mesh having the inserted new mesh for simulating the deformation process, wherein variables are transferred from the deformed mesh to the deformed mesh having the inserted new mesh;

perform deformation analysis on the deformed mesh having the inserted new mesh;

determine whether results of the performed deformation analysis satisfy a threshold;

adjust one or more parameters of the object represented by the deformed mesh having the inserted new mesh based on the performed deformation analysis;

determine whether results of the performed deformation analysis satisfy a threshold;

wherein adjustment of the one or more parameters is in response to determining the results of the performed deformation analysis satisfy the threshold;

perform a further deformation analysis using the adjusted one or more parameters; and determine whether results of the further deformation analysis satisfy the threshold.

9. The data processing system of claim 8, wherein the deformation analysis includes simulation of conditions experienced by the object during the deformation process.

10. The data processing system of claim 8, wherein the one or more parameters comprise a dimension associated with the object or a material associated with the object.

11. The data processing system of claim 8, wherein to determine the new mesh comprising the crack to be inserted into the deformed mesh, the processing system to:

identify size, orientation and location of the crack; and in response to a request, generate contact elements or target elements based on the identified size, orientation and location of the crack.

12. The data processing system of claim 8, wherein the processing system is further to:

map boundary conditions and loads from the deformed mesh to the deformed mesh having the inserted new mesh comprising the crack to transfer variables from the deformed mesh to the deformed mesh having the inserted new mesh comprising the crack.

13. The data processing system of claim 8, wherein the processing system is further to:

upon inserting the new mesh comprising the crack into the deformed mesh, map solution variables consistently from the deformed mesh to the deformed mesh having the inserted new mesh comprising the crack to satisfy constitutive and kinematic equations with minimum change to a distribution in space of the solution variables.

14. The data processing system of claim 8, wherein the processing system is further to:

upon inserting the new mesh comprising the crack into the deformed mesh, balance unbalanced forces associated with the crack in the new mesh.

15. A non-transitory computer-readable storage medium including instructions that, when executed by a processing system, cause the processing system to:

calculate a deformed mesh representing an object during a deformation process;

determine a new mesh comprising a crack to be inserted into the deformed mesh;

insert the new mesh comprising the crack into the deformed mesh to obtain a deformed mesh having the inserted new mesh for simulating the deformation process wherein variables are transferred from the deformed mesh to the deformed mesh having the inserted new mesh;

perform deformation analysis on the deformed mesh having the inserted new mesh;

determine whether results of the performed deformation analysis satisfy a threshold;

adjust one or more parameters of the object represented by the deformed mesh having the inserted new mesh, wherein the one or more parameters are adjusted in response to determining the results of the performed deformation analysis satisfy the threshold;

perform a further deformation analysis using the adjusted one or more parameters; and determine whether results of the further deformation analysis satisfy the threshold.

16. The non-transitory computer-readable storage medium of claim 15, wherein the deformation analysis includes simulation of conditions experienced by the object during the deformation process.

17. The non-transitory computer-readable storage medium of claim 15, wherein the one or more parameters comprise a dimension associated with the object or a material associated with the object.

18. The non-transitory computer-readable storage medium of claim 15, wherein to determine the new mesh comprising the crack to be inserted into the deformed mesh, the processing system to:
identify size, orientation and location of the crack; and
in response to a request, generate contact elements or target elements based on the identified size, orientation and location of the crack.

19. The non-transitory computer-readable storage medium of claim 15, wherein the processing system is further to:
map boundary conditions and loads from the deformed mesh to the deformed mesh having the inserted new mesh comprising the crack to transfer variables from the deformed mesh to the deformed mesh having the inserted new mesh comprising the crack.

20. The non-transitory computer-readable storage medium of claim 15, wherein the processing system is further to:
upon inserting the new mesh comprising the crack into the deformed mesh, map solution variables consistently from the deformed mesh to the deformed mesh having the inserted new mesh comprising the crack to satisfy constitutive and kinematic equations with minimum change to a distribution in space of the solution variables.

21. The non-transitory computer-readable storage medium of claim 15, wherein the processing system is further to:
upon inserting the new mesh comprising the crack into the deformed mesh, balance unbalanced forces associated with the crack in the new mesh.

\* \* \* \* \*